(12) United States Patent
Sumitani

(10) Patent No.: US 6,245,660 B1
(45) Date of Patent: Jun. 12, 2001

(54) PROCESS FOR PRODUCTION OF SEMICONDUCTOR DEVICE HAVING CONTACT PLUGS WITH REDUCED LEAKAGE CURRENT

(75) Inventor: Hidetoshi Sumitani, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/511,328

(22) Filed: Feb. 23, 2000

(30) Foreign Application Priority Data

Feb. 23, 1999  (JP) ................................................. 11-044952

(51) Int. Cl.$^7$ .................................................... H01L 21/44
(52) U.S. Cl. ............................................. 438/620; 438/770
(58) Field of Search .................................... 438/675, 678, 438/635, 639, 696, 702, 265, 259, 620, 680, 770, 672

(56) References Cited

U.S. PATENT DOCUMENTS

| | | | |
|---|---|---|---|
| 5,312,775 | * | 5/1994 | Fujii et al. ............................. 438/625 |
| 5,728,595 | * | 3/1998 | Fukase ................................. 438/241 |
| 6,060,346 | * | 5/2000 | Roh et al. ............................. 438/200 |

* cited by examiner

Primary Examiner—David Nelms
Assistant Examiner—David Nhu
(74) Attorney, Agent, or Firm—McGinn & Gibb PLLC

(57) ABSTRACT

A method for making a semiconductor device having an inter-layer insulating film formed on a semiconductor substrate and contact plugs contacting with the surface of the semiconductor substrate includes forming, in an inter-layer insulating film formed on a semiconductor substrate, holes by anisotropic etching so that the surface of the semiconductor substrate is exposed, forming a CVD insulating film on the surface of the resulting wafer including the inner surface of each hole, heating in an oxygen-containing atmosphere to form a thermal oxide film at the surface portion of the semiconductor substrate at the bottom of each hole, etching back the CVD insulating film of the bottom of each hole while simultaneously removing the thermal oxide film formed in the thermal oxidation to expose the surface of the semiconductor substrate, and filling each hole with a conductive material to form each contact plug. The present process produces a semiconductor device in which the side wall made of CVD insulating film of the contact plug portion makes no contact with the surface of the substrate, so generation of leakage current is suppressed and, particularly in the memory circuit region, the holding property is excellent.

20 Claims, 5 Drawing Sheets

PROCESS FOR PRODUCTION OF SEMICONDUCTOR DEVICE HAVING CONTACT PLUGS WITH REDUCED LEAKAGE CURRENT

BACKGROUND OF THE INVENTION

1. Field of the Invention

The present invention relates to a process for producing a semiconductor device having fine contact plugs.

2. Description of the Related Art

In recent years, as semiconductor devices have become fine, the diffused layers formed in the semiconductor substrate have become fine as well. In this connection, the contact plugs electrically connecting these fine diffused layers with electrodes are becoming increasingly fine.

Contact plugs have heretofore been formed by forming contact holes in the inter-layer insulating film formed on a semiconductor substrate so as to reach the diffused layers formed in the semiconductor substrate and then filling each contact hole with a conductive material. However, as the contact holes become fine, the patterning therefore becomes very difficult when the diameter of hole is 1 $\mu$m or less. Hence, it is generally conducted to once form each contact hole so as to have a diameter slightly larger than actually required and then form, on the inner surface of the contact hole, a side wall made of an insulating material (e.g. silicon oxide) by CVD (chemical vapor deposition) to form fine contact holes.

In such a memory device as a storage electrode is formed above each bit line, each capacitor contact plug is present between bit lines. In order to prevent the short-circuiting between capacitor contact plug and bit lines, it is generally conducted to (1) cover the circumference of each bit line with an insulating film having an etching rate different from that of inter-layer insulating film, or (2) form an insulating film on the inner surface of each opening (each contact hole) for formation of capacitor contact plug and then fill each contact hole with a conductive material.

A conventional method for formation of fine contact plugs is described below on a case of forming a stack type capacitor of the memory cell region of DRAM, referring to FIGS. 5(a)–5(g) and FIGS. 6(a)–6(e).

First, as shown in FIG. 5(a), on a semiconductor substrate 1 having, at given positions, element-insulating regions 2 made of a silicon oxide film is formed a gate oxide film (not shown) by a thermal oxidation method or the like; then, on the whole surface of the resulting material is formed an impurity-containing polysilicon film; the polysilicon film is subjected to patterning; thereby, gate electrodes 3 are formed.

Successively, as shown in FIG. 5(b), ion implantation is conducted to form diffused layers 4; then, on the whole surface of the resulting material is formed a first inter-layer insulating film consisting of a BPSG film (a boron-phosphorus-silica glass film) or the like.

Next, as shown in FIG. 5(c), bit contact holes 6 are formed so as to reach the diffused layers 4; successively, as shown in FIG. 5(d), an insulating film 7 is formed, by CVD, on the first inter-layer insulating film 5 including the inner surface of each bit contact hole 6. The CVD insulating film 7 is etched back to form each side wall 8, as shown in FIG. 5(e).

A film made of a conductive material is formed so as to fill each bit contact hole 6 having a side wall 8; patterning is conducted; thereby, bit contact plugs 9 and bit lines 10 are formed as shown in FIG. 5(f). Then, on the whole surface of the resulting material is formed a second inter-layer insulating film 11 consisting of a BPSG film or the like, and thereon is formed an insulating film 12 [FIG. 5(g)].

Next, as shown in FIG. 6(a), capacitor contact holes 13 are formed so as to reach the diffused layers 4; then, as shown in FIG. 6(b), an insulating film 14 is formed, by CVD, on the insulating film 12 and the inner surface of each capacitor contact hole 13. Successively, the CVD insulating film 14 is etched back to form each side wall 15, as shown in FIG. 6(c).

A film made of a conductive material is formed so as to fill each capacitor contact hole 13 having a side wall 15; patterning is conducted; thereby, each capacitor contact plug 16 and each storage electrode 17 are formed as shown in FIG. 6(d).

Then, a capacitor insulating film (not shown) is formed. Thereon is formed an impurity-containing polysilicon film 18 for formation of plate electrode, whereby a capacitor structure is formed. Thereon is formed a third inter-layer insulating film (not shown), after which other constituents such as upper wiring and the like (not shown) are formed.

In the above conventional constitution, however, each side wall consisting of a CVD insulating film makes direct contact with the surface of a semiconductor substrate, which caused formation of GR center (generation-recombination center) to generate leakage current. This generation of leakage current particularly in the capacitor contact plugs of memory circuit is a very serious problem because it makes difficult the securement of a sufficient capacity in the current situation in which semiconductor devices are becoming increasingly fine.

SUMMARY OF THE INVENTION

The object of the present invention is to provide a process for producing a semiconductor device in which the leakage current of contact plug portion is suppressed, particularly a semiconductor device having good holding property at the memory circuit region.

The first aspect of the present invention lies in a process for producing a semiconductor device comprising an inter-layer insulating film formed on a semiconductor substrate and contact plugs contacting with the surface of the semiconductor substrate, each formed in the inter-layer insulating film by filling a conductive material into each contact hole having a side wall made of a CVD insulating film, which process comprises:

a step of forming, in an inter-layer insulating film formed on a semiconductor substrate, holes by anisotropic etching so that the surface of the semiconductor substrate is exposed, a step of forming a CVD insulating film on the surface of the resulting wafer including the inner surface of each hole, a thermal oxidation step of conducting heating in an oxygen-containing atmosphere to form a thermal oxide film at the surface portion of the semiconductor substrate at the bottom of each hole, a step of etching back the CVD insulating film of the bottom of each hole and simultaneously removing the thermal oxide film formed in the thermal oxidation step, to expose the surface of the semiconductor substrate, and a step of filling each hole with a conductive material to form each contact plug.

The second aspect of the present invention lies in a process for producing a semiconductor device according to the above process, which process comprises after the thermal oxidation step, a step of forming a silicon nitride film on the surface of the wafer including the inner surface of each hole, and then etching back the silicon nitride film and the CVD insulating film of the bottom of each hole and simultaneously removing the thermal oxide film formed in the thermal oxidation step, to expose the surface of the semiconductor substrate.

The third aspect of the present invention lies in a process for producing a semiconductor device having a structure comprising a plurality of insulating films different in heat-flowability, laminated on a semiconductor substrate, which process comprises:

a step of laminating a plurality of insulating films on a semiconductor substrate, a step of forming contact holes so as to extend through the plurality of insulating films, a step of forming a side wall in each contact hole, and a step of conducting a heat treatment after the formation of the side wall.

The fourth aspect of the present invention lies in a process for producing a semiconductor device according to the third aspect of the present invention, wherein the contact holes are formed so that the surface of the semiconductor substrate is exposed, and the heat treatment is conducted in an oxygen-containing atmosphere so that a thermal oxide film is formed at the surface portion of the semiconductor substrate contacting with the side wall.

In the semiconductor device produced by the present process, the side wall of contact plug portion, consisting of a CVD insulating film makes no contact with the surface of substrate; therefore, generation of leakage current is suppressed and, particularly in the memory circuit region, the holding property is excellent.

In the present process, each opening formed for formation of contact plug is not deformed in the depth direction; therefore, each side wall is formed uniformly and good insulation can be secured. Further, contact between contact plug bottom and substrate is sufficient, making possible good electrical contact. Furthermore, ion implantation conducted for optimum concentration profile of diffused layer before filling of opening is easy.

DETAILED DESCRIPTION OF THE PREFERRED EMBODIMENTS

Figure 5:
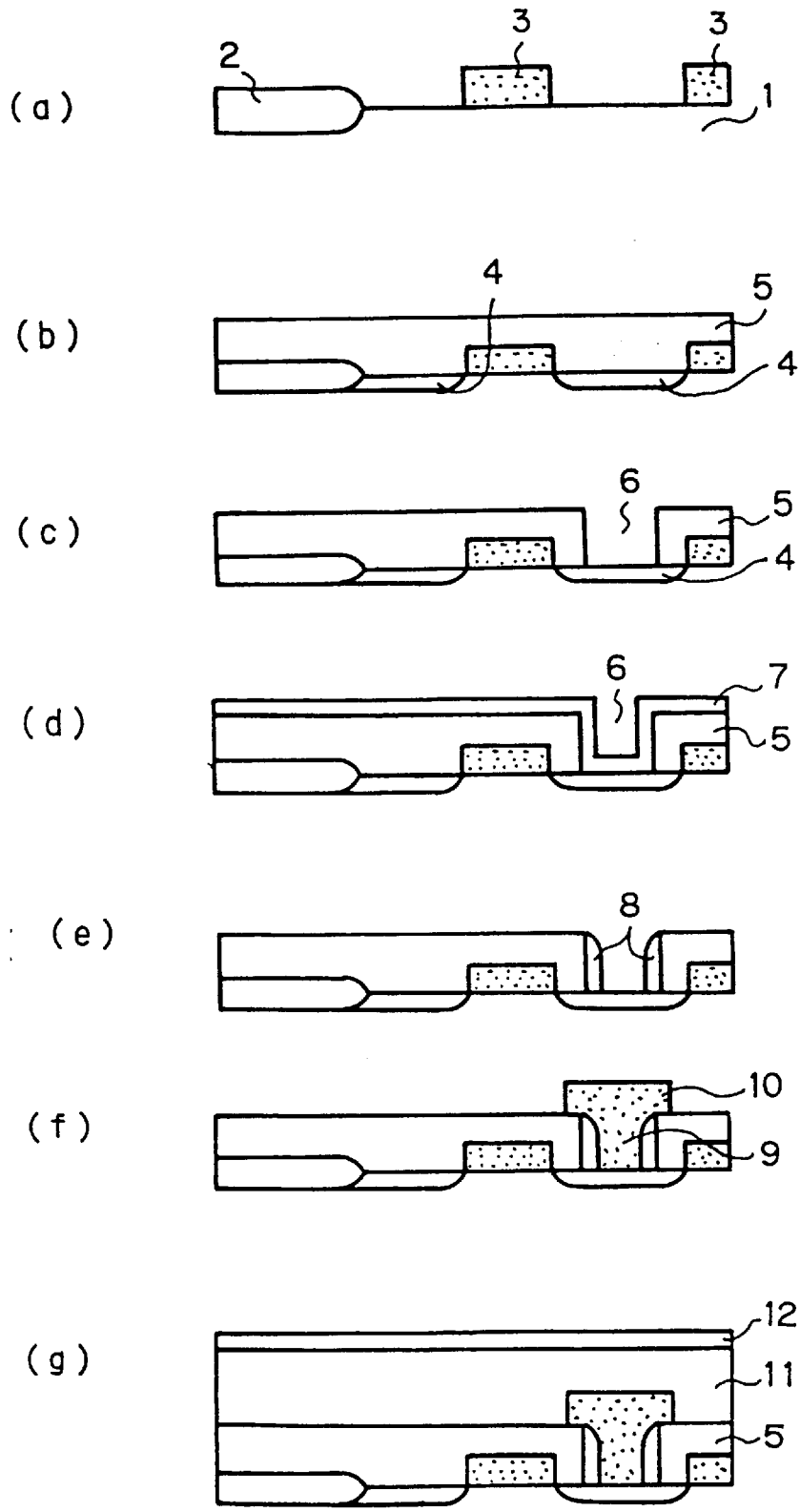
FIGS. 5(a)–5(g) are sectional views of steps for explaining a conventional process.
Figure 6:
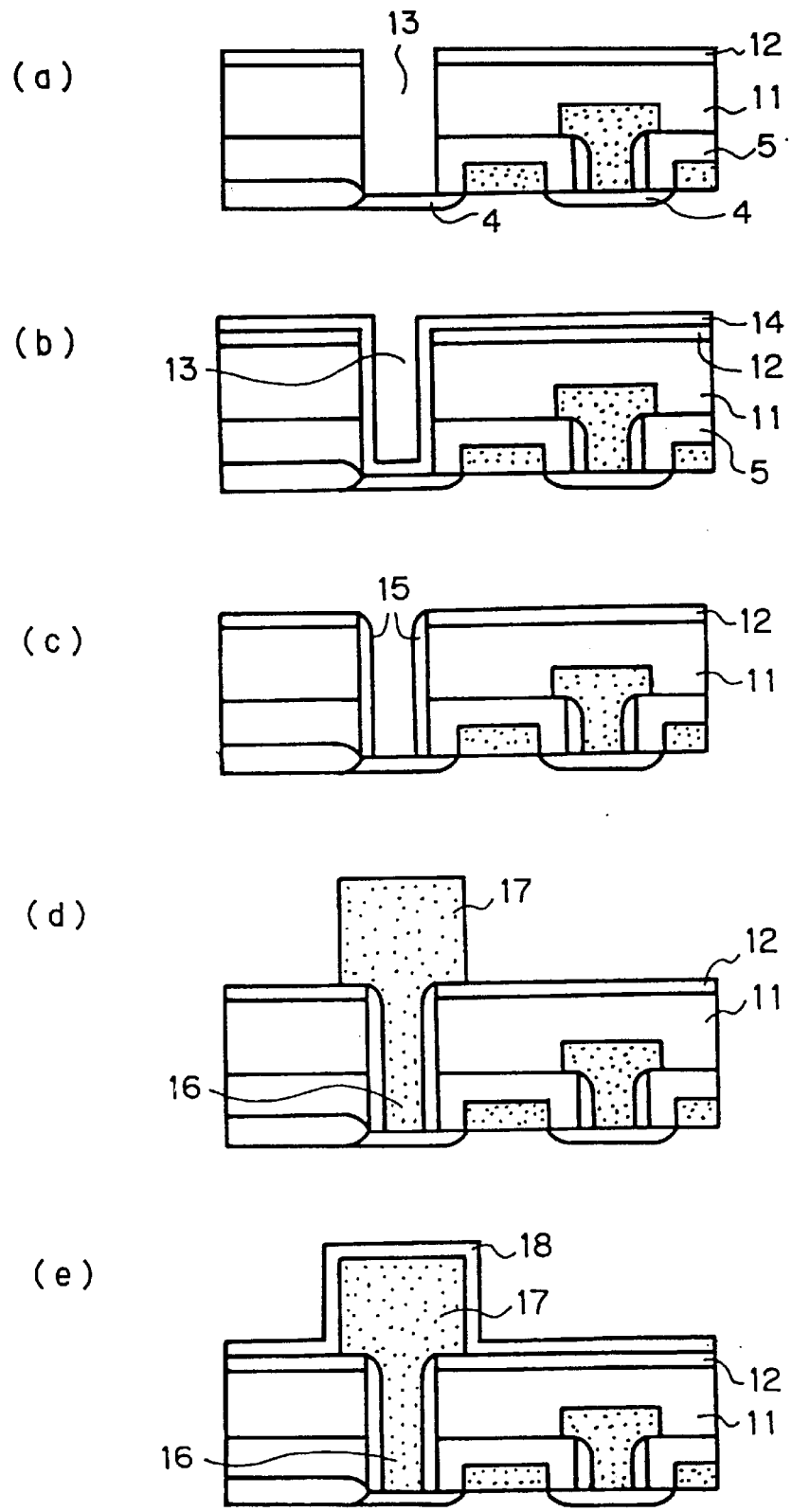
FIGS. 6(a)–(e) are sectional views of steps for explaining a conventional process.

The present invention is described below in detail by explaining preferred embodiments. First embodiment First, as shown in FIG. 1(a), a structure is produced in which a MOS transistor is formed on a semiconductor substrate (e.g. a silicon substrate) 1 and an inter-layer insulating film is formed on the MOS transistor. This structure is produced in the same manner as for the above-mentioned structure shown in FIG. 5(g). In FIG. 1(a), numeral 2 refers to an element-isolating region; numeral 3 refers to a gate electrode; numeral 4 refers to a diffused layer; numeral 5 refers to a first inter-layer insulating film; numeral 8 refers to a side wall consisting of a CVD insulating film; numeral 9 refers to a bit contact plug; numeral 10 refers to a bit line; numeral 11 refers to a second inter-layer insulating film; and numeral 12 refers to an insulating film.

The first and second inter-layer insulating films 5 and 11 are made of an insulating material such as BPSG film or the like, and are formed by CVD or the like in thicknesses of about 250 to 4,000 nm and about 200 to 4,000 nm, respectively. The first and second inter-layer insulating films 5 and 11 have heat-flowability and are flattened by a heat treatment of, for example, 850° C. and about 30 minutes. The first and second inter-layer insulating films 5 and 11, when being a BPSG film, show lower heat-flowability after each heat treatment.

The insulating film 12 is a film formed as a stopper for the wet etching for removal of a natural oxide film on a storage electrode, conducted before formation of a capacitor insulating film, and is formed as an NSG film or the like, by CVD or the like, in a thickness of about 400 to 500 nm.

In Example 1, the first and second inter-layer insulating films were formed as a BPSG film in thicknesses of 300 nm and 450 nm, respectively. The insulating film 12 was formed as an NSG film in a thickness of about 300 nm.

First, as shown in FIG. 1(a), a structure is produced in which a MOS transistor is formed on a semiconductor substrate (e.g. a silicon substrate) 1 and an inter-layer insulating film is formed on the MOS transistor.

Next, as shown in FIG. 1(b), an opening 19 is formed on the diffused layer 4 so that the surface of the semiconductor substrate is exposed. This opening 19 is formed by subjecting the insulating film 12 and the first and second inter-layer insulating films to anisotropic etching using a resist as a mask. After the formation of the opening 19, the resist is removed by etching; then, SPM cleaning (sulfuric acid-hydrogen peroxide mixture cleaning) is conducted.

Next, as shown in FIG. 1(c), on the insulating film 12 and the inner surface of the opening 19 is formed, by CVD, a CVD insulating film 14 made of a silicon oxide film or the like, in a thickness of about 50 to 100 nm. In this case, the thickness of the CVD insulating film 14 must be set so that the opening 19 is not blocked. As the CVD insulating film, there can be used not only a silicon oxide film but also a TEOSNSG (tetraethyl ortho-silicate non-doped silicate glass) film or a HTO (high-temperature oxide) film.

Successively, at the surface portion of semiconductor substrate at the bottom of opening 19 is formed a thermal oxide film (not specifically shown) having a thickness of 5 to 10 nm, by a heat treatment in an oxygen-containing atmosphere. The formation of this thermal oxide film is conducted preferably at a temperature of 700 to 850° C. for about 10 to 60 minutes. The oxygen-containing atmosphere may be an oxygen atmosphere or an atmosphere in which oxygen is diluted with an inert gas such as nitrogen, argon or the like. The more preferred thermal oxidation conditions are 780 to 820° C. for 10 to 30 minutes. In Example 1, thermal oxidation was conducted in an oxygen atmosphere at 800° C. for 20 minutes. Though the CVD film 14 is formed (present) at the surface of the bottom of the opening, thermal oxidation takes place at the surface of the silicon substrate and a silicon oxide film, i.e. a thermal oxide film is formed because the CVD film 14 has oxygen permeability.

Figure 1:
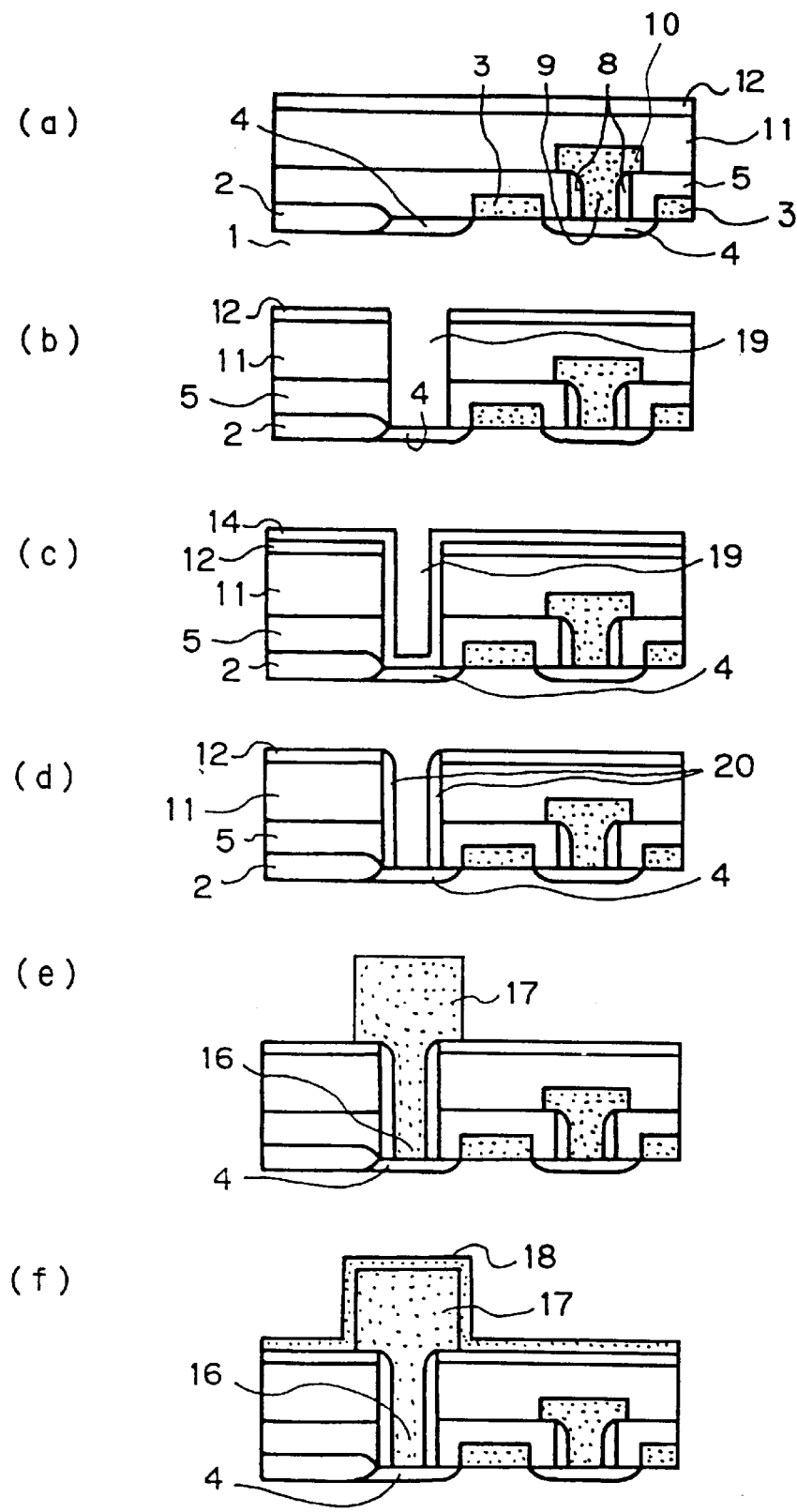
FIGS. 1(a)–(f) are sectional views of steps for explaining the process of the present invention.

Successively, as shown in FIG. 1(*d*), the etching-back of the CVD insulating film 14 is conducted by anisotropic etching to form a side wall 20 and remove the thermal oxide film at the surface of the semiconductor substrate to expose the substrate surface. Then, APM cleaning (ammonia-hydrogen peroxide mixture cleaning) is conducted. In Example 1, an opening of 0.2 μm in diameter was formed and the diameter after formation of side wall was 0.14 μm.

Then, a film is formed with a conductive material such as impurity-containing polysilicon or the like so as to fill the opening (capacitor contact hole) in which the side wall 20 has been formed; the film is subjected to patterning; thereby, a capacitor contact plug 16 and a storage electrode 17 are formed, as shown in FIG. 1(*e*).

Then, a capacitor insulating film (not shown) is formed. Thereon is formed an impurity-containing polysilicon film 18 for formation of plate electrode, whereby is formed a capacitor structure as shown in FIG. 1(*f*). Thereon is formed a third inter-layer insulating film (not shown), after which other constituents (not shown) such as upper wiring and the like are formed.

In the above first embodiment of the present invention, the side wall of contact plug portion consisting of a CVD insulating film makes no direct contact with the surface of substrate; therefore, generation of leakage current is suppressed and an excellent holding property is obtained.

Figure 3:
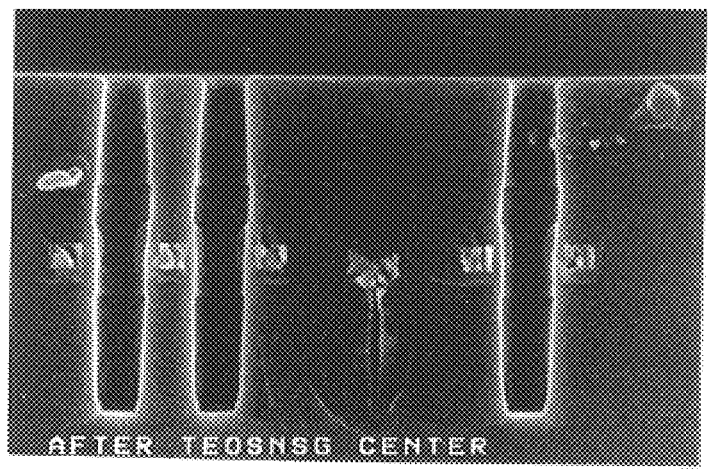
FIG. 3 is a SEM photograph showing the sectional shapes of capacitor contact plugs formed by the process of the present invention.
Figure 4:
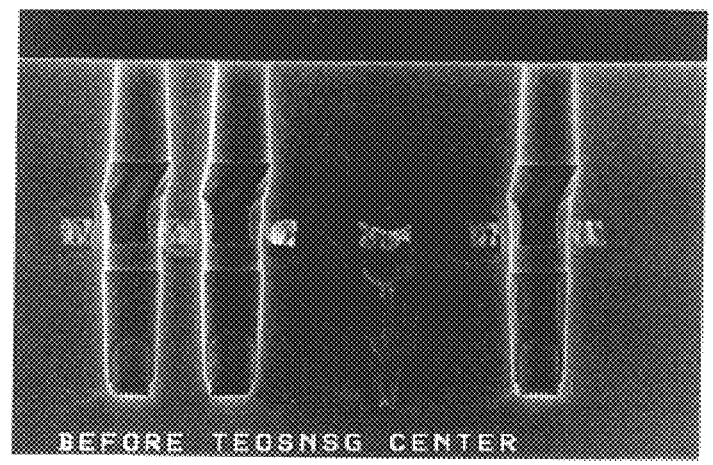
FIG. 4 is a SEM photograph showing the sectional shapes of capacitor contact plugs formed by the process of Reference Example.

The other effect of the present invention is described referring to FIG. 3 and FIG. 4. FIG. 3 is a SEM photograph showing the sectional shapes of the capacitor contact plugs formed by the first embodiment (Example 1) of the present invention. FIG. 4 is a SEM photograph showing the sectional shapes of the capacitor contact plugs (Reference Example) formed in the same manner as in Example 1 except that thermal oxidation was conducted before formation of a CVD insulating film 14, to form a thermal oxide film at the bottom of opening.

As is clear from the comparison of FIG. 3 and FIG. 4, the contact plugs shown in FIG. 4 (Reference Example) are tilted rightward and deformed at the portions slightly above the bit lines present at the both sides of each contact plug at about the center of each contact plug. Such deformation is striking at the ends of each cell array. The deformation is not seen in the contact plugs of the present process shown in FIG. 3 (Example 1).

The deformation of contact plugs in Reference Example is thought to be caused by, for example, the thermal expansion of inter-layer insulating film in thermal oxidation step. Striking deformation at the area of the cell array end is presumed to be because a vacant space is present at the sides of the cell array and the deformation of opening takes place easily. Meanwhile, small deformation at around the center of cell array is presumed to be because, at around the center, the stress caused by, for example, the expansion of inter-layer insulating film is applied to each opening from its circumference almost evenly and each opening shows small deformation. Large deformation of contact plug at the portion corresponding to the second inter-layer insulating film is thought to be because the first inter-layer insulating film, i.e. the BPSG film undergoes two times of quench hardening owing to the quench hardening conducted for formation of the second inter-layer insulating film and, therefore, the first inter-layer insulating film has a higher mechanical strength than the second inter-layer insulating film.

Deformation of contact plugs such as shown in FIG. 4 (Reference Example) gives rise to the following problems.
First Problem When the CVD insulating film is etched back to remove the CVD film portion at the bottom of the opening, even the CVD insulating film portion at the side of opening, i.e. the side wall of opening is etched at the deformed portion; as a result, the side wall becomes non-uniform in thickness or is lost partly. The portion of side wall having a small thickness or a zero thickness has reduced insulation and tends to have insufficient insulation to, in particular, bit line.
Second Problem When the CVD insulating film is etched back to remove the CVD film portion at the bottom of the opening, deformation of opening generates a shadow at the bottom of the opening and makes insufficient the removal of the CVD insulating film portion at the bottom of the opening; as a result, the contact area between substrate and contact plug is reduced, which easily incurs increased contact resistance and poor contact.
Third problem When the inside of opening is cleaned with a cleaning solution before the opening is filled with a conductive material, the presence of small-thickness or zero-thickness portion in side wall may cause corrosion of inter-layer insulating film by the cleaning solution, which in turn may incur insufficient insulation to inter-layer wirings such as bit line and the like.
Fourth Problem When ion implantation into substrate surface from opening is conducted for optimum concentration profile of diffused layer, deformation of opening gives rise to a shadow at the bottom of the opening and makes impossible the uniform ion implantation into the substrate surface portion at the bottom of the opening; as a result, no desired concentration profile is obtainable.

In Example 1, no deformation of opening takes place after the thermal oxidation step; therefore, none of the above-mentioned problems caused by deformation of opening arises. It is thought that in the present invention, since the thermal oxidation step is conducted after the formation of side wall, the side wall has an increased mechanical strength and therefore no deformation takes place.

Figure 2:
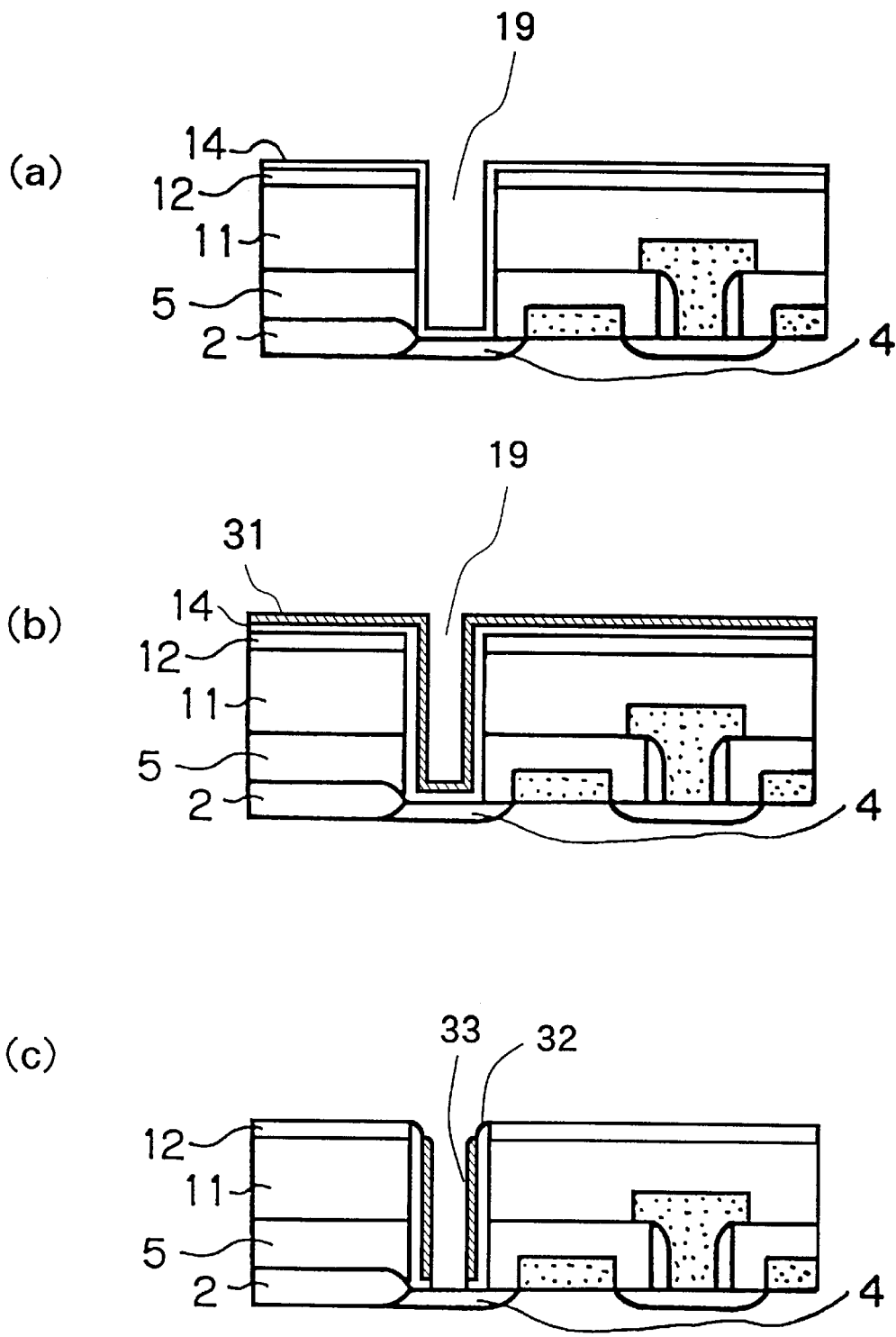
FIGS. 2(a)–(c) are sectional views of steps for explaining the process of the present invention.

Next, description is made on the second embodiment of the present invention referring to FIG. 2.

In the second embodiment, a CVD insulating film 14 made of silicon oxide or the like is formed to obtain the same structure as shown in FIG. 1(*c*) [FIG. 2(*a*)]; then, a thermal oxidation step is conducted; thereafter, a silicon nitride film 31 is laminated on the CVD insulating film 14, by CVD [FIG. 2(*b*)]; successively, etching-back is conducted [FIG. 2(*c*)]. As a result, there is formed a two-layered side wall consisting of a side wall 32 (consisting of a CVD insulating film) and a side wall 33 (consisting of a silicon nitride film 31).

In Example 2, each contact plug was formed in the same manner as in Example 1 except that a silicon nitride film was laminated as above and the final diameter of opening was set at 0.08 μm.

Since a silicon nitride film can be formed more easily than a silicon oxide film, a side wall consisting of a silicon nitride film can be formed satisfactorily and, moreover, the diameter of opening can be made smaller. Further, since a silicon nitride film has higher resistance to chemicals than a silicon oxide film, corrosion of inter-layer insulating film hardly takes place in the cleaning of opening inside and the selection of cleaning solution can be made from a wider variety of kinds; as a result, it is possible to conduct the cleaning of opening inside efficiently and easily. Furthermore, since etching-back is conducted after a silicon nitride film has been laminated on a CVD insulating film, the side wall 33 consisting of a silicon nitride film makes no direct contact with the semiconductor substrate, as shown in FIG. 2(c).

When a silicon nitride film is formed, it is necessary that the thermal oxidation step is conducted after formation of a CVD insulating film made of silicon oxide or the like but before formation of the silicon nitride film. This is because a silicon nitride film has low oxygen permeability and therefore, if thermal oxidation is conducted after formation of the silicon nitride film, formation of a thermal oxide film at the substrate surface portion at the bottom of opening is difficult.

What is claimed is:

1. A process for producing a semiconductor device comprising an inter-layer insulating film formed on a semiconductor substrate and contact plugs contacting with the surface of the semiconductor substrate, each said contact plug formed in the inter-layer insulating film by filling a conductive material into each contact hole having a side wall made of a CVD insulating film, said process comprising:

forming, in an inter-layer insulating film formed on a semiconductor substrate, holes by anisotropic etching so that the surface of the semiconductor substrate is exposed;

forming a CVD insulating film on the surface of the resulting wafer including the inner surface of each hole;

conducting heating in an oxygen-containing atmosphere to form a thermal oxide film at the surface portion of the semiconductor substrate at the bottom of each hole;

etching back the CVD insulating film of the bottom of each hole and simultaneously removing the thermal oxide film formed in the thermal oxidation, to expose the surface of the semiconductor substrate; and filling each hole with a conductive material to form each contact plug.

2. A process for producing a semiconductor device according to claim 1, wherein the CVD insulating film has oxygen permeability.

3. A process for producing a semiconductor device according to claim 1, wherein the CVD insulating film is made of silicon oxide.

4. A process for producing a semiconductor device according to claim 1, wherein the inter-layer insulating film comprises a first inter-layer insulating film having contact plugs and wirings, and a second inter-layer insulating film formed on the first inter-layer insulating film.

5. A process for producing a semiconductor device according to claim 4, wherein the inter-layer insulating film is made of BPSG.

6. A process for producing a semiconductor device according to claim 1, further comprising:

after forming said thermal oxide film, forming a silicon nitride film on the surface of the wafer including the inner surface of each hole, and then etching back the silicon nitride film and the CVD insulating film of the bottom of each hole and simultaneously removing the thermal oxide film, to expose the surface of the semiconductor substrate.

7. A process for producing a semiconductor device according to claim 1, wherein the semiconductor substrate comprises a silicon substrate.

8. A process for producing a semiconductor device according to claim 1, wherein each contact plug formed comprises a contact plug contacting with a storage electrode of stack type capacitor of DRAM.

9. A process for producing a semiconductor device having a structure comprising a plurality of insulating films different in heat-flowability, laminated on a semiconductor substrate, which process comprises:

laminating a plurality of insulating films on a semiconductor substrate;

forming contact holes so as to extend through the plurality of insulating films;

forming a side wall in each contact hole; and conducting a heat treatment after the formation of the side wall to form a thermal oxide film.

10. A process for producing a semiconductor device according to claim 9, wherein at least one of the plurality of insulating layers is made of BPSG.

11. A process for producing a semiconductor device according to claim 9, wherein the contact holes are formed so that the surface of the semiconductor substrate is exposed, and the heat treatment is conducted in an oxygen-containing atmosphere so that a thermal oxide film is formed at the surface portion of the semiconductor substrate contacting with the side wall.

12. A process for producing a semiconductor device according to claim 11, wherein the side wall comprises of a CVD insulating film.

13. A method of reducing leakage current in a semiconductor device having contact plugs, said method comprising:

forming a thermal oxide layer on the sidewalls supporting said contact plugs prior to filling in the contact plugs.

14. The method of claim 13, further comprising the depositing of a layer having oxygen permeability.

15. The method of claim 13, further comprising the depositing of a layer of silicon nitride prior to filling in the contact plugs.

16. A method of reducing leakage current and enhancing a holding property in a memory device having contact plugs, said method comprising the formation of a thermal oxide layer on the sidewalls supporting said contact plugs prior to filling in the contact plugs.

17. The method of claim 1, wherein said sidewall includes the CVD insulating film which makes no contact with the surface of the semiconductor substrate.

18. The method of claim 9, wherein said sidewall includes an insulating film which makes no contact with the surface of the semiconductor substrate.

19. The method of claim 13, wherein said sidewall includes an insulating film which makes no contact with the surface of the semiconductor substrate.

20. The method of claim 16, wherein said sidewall includes an insulating film which makes no contact with the surface of the semiconductor substrate.

* * * * *